(12) United States Patent
Dong et al.

(10) Patent No.: US 11,996,017 B2
(45) Date of Patent: May 28, 2024

(54) ARRAY SUBSTRATE AND SPLICING SCREEN

(71) Applicant: BOE Technology Group Co., Ltd., Beijing (CN)

(72) Inventors: Shuilang Dong, Beijing (CN); Xinhong Lu, Beijing (CN); Jingshang Zhou, Beijing (CN); Lei Zhao, Beijing (CN); Zhanfeng Cao, Beijing (CN); Dapeng Xue, Beijing (CN); Lizhong Wang, Beijing (CN); Guangcai Yuan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 397 days.

(21) Appl. No.: 17/508,866

(22) Filed: Oct. 22, 2021

(65) Prior Publication Data
US 2022/0293018 A1  Sep. 15, 2022

(30) Foreign Application Priority Data

Mar. 9, 2021  (CN) ......................... 202110257272.X

(51) Int. Cl.
*H01L 33/62* (2010.01)
*G09F 9/302* (2006.01)
*G09F 9/33* (2006.01)
*H10K 77/10* (2023.01)

(52) U.S. Cl.
CPC .............. *G09F 9/3026* (2013.01); *G09F 9/33* (2013.01); *H01L 33/62* (2013.01); *H10K 77/111* (2023.02)

(58) Field of Classification Search
None
See application file for complete search history.

(56) References Cited

U.S. PATENT DOCUMENTS

| 2018/0123060 A1* | 5/2018 | Jang ..................... H10K 77/111 |
| 2019/0229160 A1* | 7/2019 | Lee ....................... H10K 59/131 |
| 2020/0136066 A1* | 4/2020 | Jin ....................... G06F 3/04164 |
| 2023/0371308 A1* | 11/2023 | Choi .................... H10K 59/124 |

* cited by examiner

*Primary Examiner* — Evren Seven
(74) *Attorney, Agent, or Firm* — IPro, PLLC

(57) ABSTRACT

The present application discloses an array substrate and a splicing screen. The array substrate provided by an embodiment of the present application includes: a flexible base, wherein the flexible base includes a display region, a first region and a second region, the display region and at least one of the first region and the second region are located in different planes, and the first region is located between the display region and the second region; a plurality of signal lines, arranged on the display region and the first region; a plurality of fan-out lines, arranged on the second region and connected with the plurality of signal lines in a one-to-one correspondence; and a buffer cushion, arranged on the first region, wherein an orthographic projection of the buffer cushion on the flexible base does not overlap with orthographic projections of the signal lines on the flexible base.

20 Claims, 7 Drawing Sheets

ARRAY SUBSTRATE AND SPLICING SCREEN

CROSS REFERENCE TO RELATED APPLICATIONS

The present disclosure claims priority to Chinese Patent Application No. 202110257272.X filed with the China National Intellectual Property Administration on Mar. 9, 2021, the entire contents of which are incorporated herein by its reference.

FIELD

The present application relates to the technical field of displaying, in particular to an array substrate and a splicing screen.

BACKGROUND

In order to realize a frameless full screen, in a splicing display product, bonding of a driving chip on a back surface of a display panel is needed.

SUMMARY

Embodiments of the present application provide an array substrate and a splicing screen.

An embodiment of the present application provides an array substrate, including: a flexible base, including: a display region, a first region and a second region, wherein the display region and at least one of the first region and the second region are located on different planes, and the first region is between the display region and the second region; a plurality of signal lines, on the display region and the first region; a plurality of fan-out lines, on the second region, connected with the plurality of signal lines in a one-to-one correspondence; and a buffer cushion, on the first region, wherein an orthographic projection of the buffer cushion on the flexible base does not overlap with orthographic projections of the signal lines on the flexible base.

In some embodiments, the plurality of signal lines are divided into a plurality of signal line groups, each of the plurality of signal line groups includes at least two adjacent signal lines in the plurality of signal lines; and a distance between any two adjacent signal lines located in one same signal line group in the plurality of signal line groups is smaller than a distance between any two adjacent signal lines located in different signal line groups in the plurality of signal line groups.

In some embodiments, the buffer cushion is between at least two adjacent signal line groups in the plurality of signal line groups.

In some embodiments, the plurality of buffer cushions are included, the plurality of signal lines extend in a first direction, the plurality of signal line groups are arranged in sequence in a second direction, the first direction and the second direction mutually intersect, the buffer cushions are disposed on two sides of at least one signal line group in the plurality of signal line groups respectively, and a connection line of the buffer cushions located on the two sides of one same signal line group in the plurality of signal line groups intersects with the first direction and the second direction.

In some embodiments, the two first regions are included and are located on two sides of the display region in the first direction respectively, and distribution rules of the plurality of buffer cushions in the two first regions are the same.

In some embodiments, distributions of the plurality of buffer cushions in the two first regions are completely consistent.

In some embodiments, the array substrate further includes a light-emitting device on the display region, and the display region is located in a plane different from both planes where the first region and the second region are located.

In some embodiments, the light-emitting device includes a micro-size inorganic light-emitting diode device.

In some embodiments, the flexible base further includes: a third region, between the display region and the first region; wherein the third region and the display region are located on a same plane, and the plurality of signal lines and a buffer cushion are further disposed in the third region.

In some embodiments, components on the flexible base include: a buffer layer, on the flexible base; a first metal layer, on the buffer layer; a first protection layer, on the first metal layer; a second metal layer, on the first protection layer and electrically connected with the first metal layer through a via hole penetrating through a thickness of the first protection layer; a passivation layer, on the second metal layer; and a second protection layer, on the passivation layer, wherein the buffer cushion is located on the second protection layer.

In some embodiments, an orthographic projection of the buffer layer and an orthographic projection of the passivation layer on the flexible base do not overlap with the orthographic projection of the buffer cushion on the flexible base.

In some embodiments, the buffer cushion includes an elastic material.

In some embodiments, the buffer cushion is cylindrical.

In some embodiments, the orthographic projection of the buffer cushion on the flexible base is circular with a radius being in a range from 25 micrometers to 50 micrometers.

In some embodiments, a thickness of the buffer cushion is in a range from 25 micrometers to 50 micrometers.

In some embodiments, a distance between the buffer cushion and one signal line of the plurality of signal lines adjacent to the buffer cushion is larger than 50 micrometers.

In some embodiments, the plurality of buffer cushions are distributed alternately on two sides of a symmetrical axis of the first region parallel to the second direction.

In some embodiments, the plurality of buffer cushions are arranged in sequence along a straight line parallel to the second direction.

An embodiment of the present application provides a splicing screen, including a plurality of array substrates.

In some embodiments, in any two adjacent array substrates first regions of which are adjacent, the buffer cushions located in the two array substrates is not contact with each other.

BRIEF DESCRIPTION OF THE DRAWINGS

In order to describe technical solutions in the embodiments of the present application more clearly, accompanying drawings needed in the description of the embodiments will be introduced briefly. It is apparent that the drawings in the description only represent some embodiments of the present application. Those ordinarily skilled in the art may obtain other drawings according to these drawings without creative work.

DETAILED DESCRIPTION OF THE EMBODIMENTS

Figure 1:
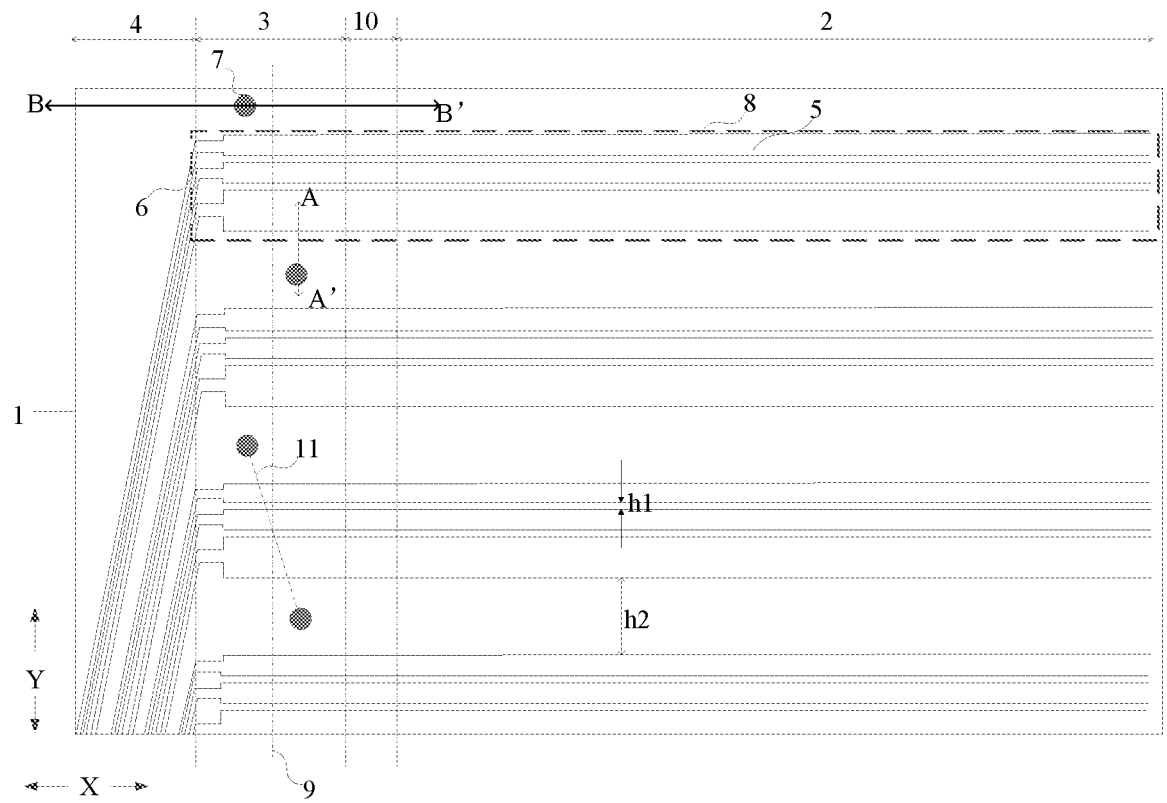
FIG. 1 is a schematic structural diagram of an array substrate provided by an embodiment of the present application.

In order to make objectives, technical solutions and advantages of embodiments of the present application clearer, the technical solutions of the embodiments of the present application will be clearly and fully described below in combination with the accompanying drawings of the embodiments of the present application. It is apparent that the described embodiments are only some, but not all of the embodiments of the present application. The embodiments and features in the embodiments of the present application may be mutually combined under the condition of no conflict. Based on the described embodiments of the present application, all other embodiments obtained by those ordinarily skilled in the art without creative work fall into the protection scope of the present application.

Unless otherwise defined, technical or scientific terms used herein should be understood commonly by those ordinarily skilled in the art of the present application. "First", "second" and other similar words used in the present application do not denote any sequence, quantity or significance, but are only used for distinguishing different components. "Include", "contain" and other similar words mean that elements or items preceding the word cover elements or items and their equivalents listed after the word without excluding other elements or items. "Connection", "joint" and other similar words are not limited to physical or mechanical connection but may include electrical connection, whether it is direct or indirect.

It should be noted that sizes and shapes of all figures in the drawings do not reflect a true scale and are only intended to illustrate contents of the present application. Same or similar reference numbers denote same or similar elements or elements with same or similar function all the time.

One common splicing technology is that a flexible array substrate is divided into a light-emitting region, a first region and a bonding region, and the bonding region is bent to a back surface of the array substrate through the first region. The first region includes a routing region, and a metal route is arranged in the routing region for being connected with a light-emitting unit of the light-emitting region and a bonding pad of the bonding region. Finally, single substrates need to be spliced one by one to form a large-size display product, so that a display mode without size limit can be realized. In actual splicing displaying, it is found that the following problems exist: in order to realize a better display effect, a size of a splicing seam needs to be controlled, side walls of the two single array substrates are squeezed unavoidably in a splicing process, and in a squeezing process, the metal route is prone to breaking, leading to poor display.

Figure 2:
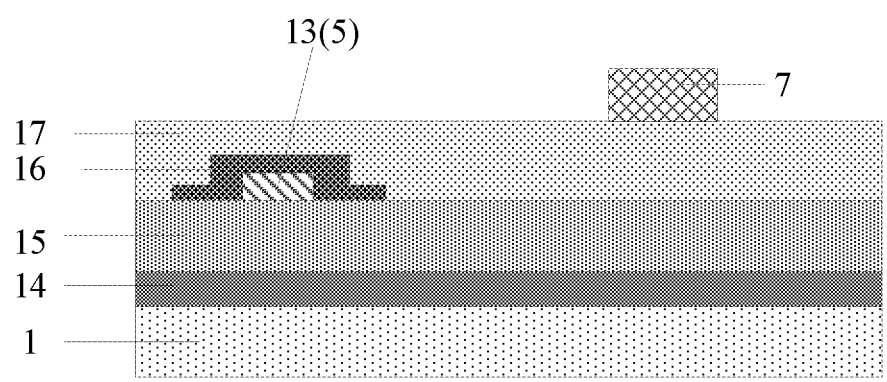
FIG. 2 is a sectional view along AA' in FIG. 1 provided by an embodiment of the present application.
Figure 3:
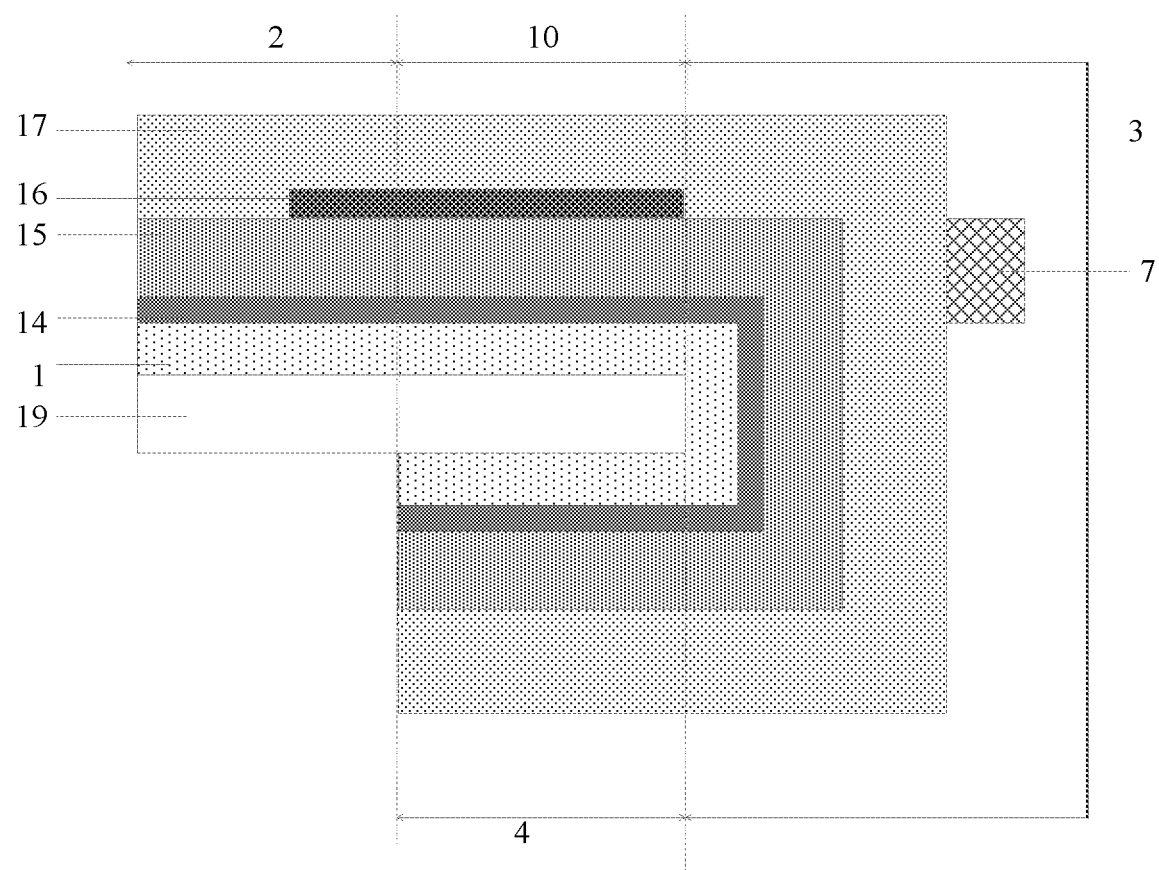
FIG. 3 is a sectional view along BB' in FIG. 1 provided by an embodiment of the present application.

An embodiment of the present application provides an array substrate, as shown in FIG. 1, FIG. 2 and FIG. 3, including a flexible base 1, a plurality of signal lines 5, a plurality of fan-out lines 6 and a buffer cushion 7.

The flexible base 1 includes a display region 2, a first region 3 and a second region 4, wherein the display region 2 and at least one of the first region 3 and the second region 4 are located on different planes, and the first region 3 is located between the display region 2 and the second region 4.

The plurality of signal lines 5 is disposed on the display region 2 and the first region 3.

The plurality of fan-out lines 6 is disposed on the second region 4 and connected with the plurality of signal lines 5 in a one-to-one correspondence.

The buffer cushion 7 is disposed on the first region 3, wherein an orthographic projection of the buffer cushion 7 on the flexible base 1 does not overlap with orthographic projections of the signal lines 5 on the flexible base 1.

Figure 4:
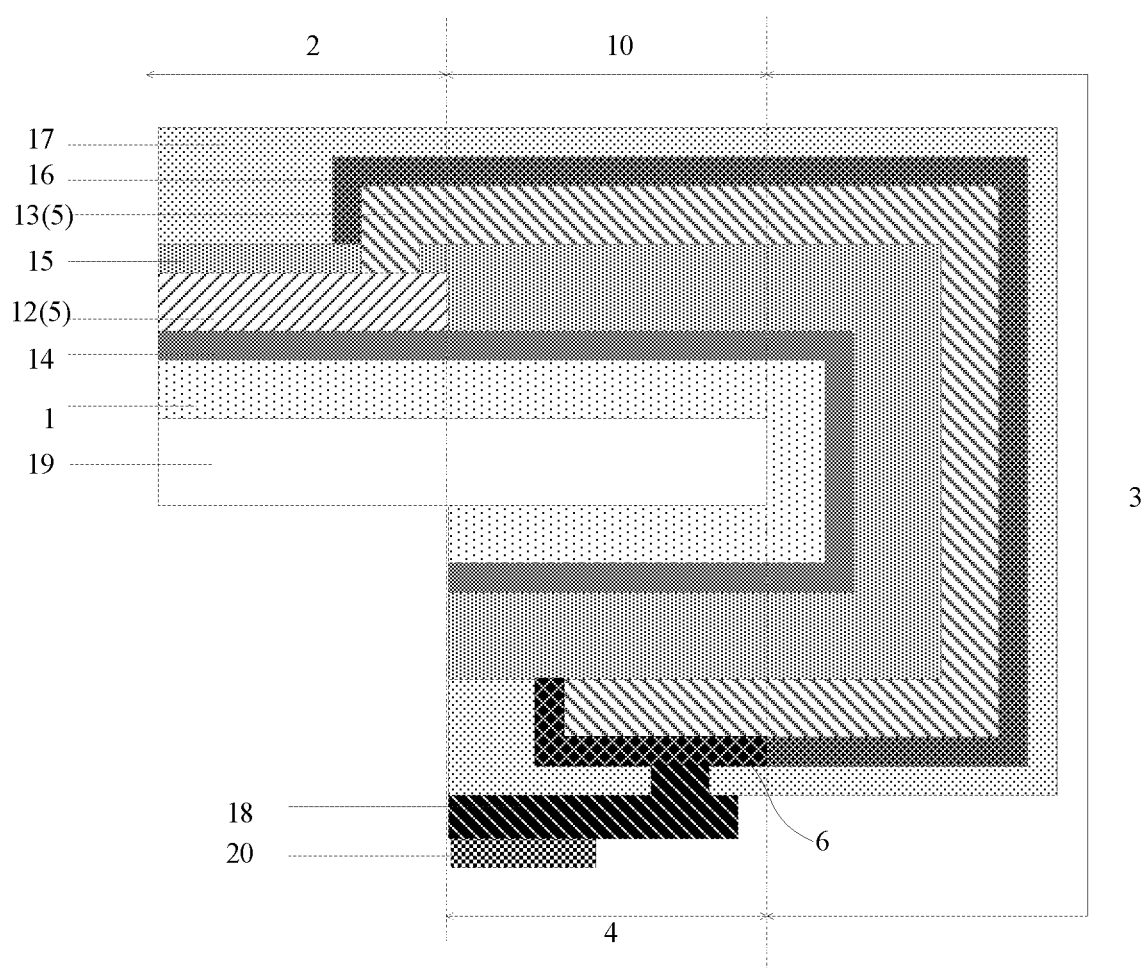
FIG. 4 is a sectional view along signal lines and fan-out lines in FIG. 1 provided by an embodiment of the present application.

It should be noted that FIG. 1 shows only part of the display region, part of the first region and part of the second region. FIG. 2 may be, for example, a sectional view along AA' in FIG. 1. FIG. 3 may be, for example, a sectional view along BB' in FIG. 1. FIG. 4 may be, for example, a sectional view along a signal line 5 and a fan-out line 6 connected with the signal line 5. Top views of the display region 2, the first region 3 and the second region 4 are shown in the same plane in FIG. 1, only serving as illustration. During specific implementation, as shown in FIG. 3 and FIG. 4, the first region may be bent, so that the second region 4 is disposed to be parallel with a back surface of the array substrate, and a main body portion of the first region 3 is located on a side surface of the array substrate. It may be understood that the side surface of the array substrate is connected with a display surface and the back surface of the array substrate.

According to the array substrate provided by the embodiment of the present application, the buffer cushion the orthographic projection of which does not overlap with the orthographic projections of the signal lines is disposed in the first region. When at least two array substrates are adjacent to each other to form a splicing display product, though the adjacent array substrates rub or squeeze each other in the first region in the splicing process, the signal lines on the array substrates can be prevented from physical damage such as breakage caused by abrasion or squeezing because of the buffer cushion disposed in the first region, and thus a yield of splicing products can be improved.

In some embodiments, as shown in FIG. 1, the plurality of signal lines 5 are divided into a plurality of signal line groups 8, and each of the signal line groups 8 includes at least two adjacent signal lines 5 in the plurality of signal lines 5.

A distance h1 between any two adjacent signal lines 5 located in one same signal line group 8 in the plurality of signal line groups 8 is smaller than a distance h2 between any two adjacent signal lines 5 located in the different signal line groups 8 in the plurality of signal line groups 8.

In some embodiments, as shown in FIG. 1, a plurality of buffer cushions 7 are included, the plurality of signal lines 5 extend in a first direction X, the plurality of signal line groups 8 are arranged in sequence in a second direction Y, and the first direction X and the second direction Y mutually intersect. As shown in FIG. 1, the first direction X may be perpendicular to the second direction Y.

During specific implementation, the display region includes a plurality of pixels arranged in an array in the first direction and the second direction. For example, one row of pixels arranged in the second direction corresponds to one signal line group, and all signal lines in the one signal line group provide signals for the one row of pixels arranged in the second direction.

In some embodiments, as shown in FIG. 1, the buffer cushions 7 are located between at least two adjacent signal line groups 8 in the plurality of signal line groups 8.

Namely, according to the array substrate provided by the embodiment of the present application, an interval between the adjacent signal line groups is larger than an interval between the respective signal lines in one signal line group, and the buffer cushion is disposed in a region where an interval between the adjacent signal lines is larger, so that the design and fabrication difficulty of the buffer cushion may be lowered.

In some embodiments, the distance h2 between the adjacent signal line groups is in a range from 100 micrometers to 1000 micrometers. During specific implementation, a numerical value range of the distance h2 between the adjacent signal line groups may be set specifically according to pixel intervals.

In some embodiments, the buffer cushions may be disposed between part of the adjacent signal line groups. Certainly, in some embodiments, as shown in FIG. 1, the buffer cushions 7 and the signal line groups 8 are distributed alternately.

In some embodiments, as shown in FIG. 1, the buffer cushions 7 are disposed on the two sides of at least one of the plurality of signal line groups 8 respectively, and a connection line 11 between the buffer cushions 7 located on the two sides of the one same signal line group 8 in the plurality of signal line groups 8 intersects with the first direction and the second direction.

Namely, orthographic projections of the buffer cushions on the two sides of the same signal line group in the plurality of signal line groups in a plane perpendicular to the second direction do not overlap with each other.

In some embodiments, as shown in FIG. 1, the plurality of buffer cushions 7 are distributed alternately on two sides of a symmetrical axis 9 of the first region parallel to the second direction Y.

In some embodiments, as shown in FIG. 1, part of the plurality of buffer cushions 7 are located at an edge of one side of the first region 3 close to the display region 2, and the rest of the plurality of buffer cushions 7 are located at an edge of one side of the first region 3 close to the second region 4.

In some embodiments, as shown in FIG. 1, the buffer cushion 7 located between a $(2N-1)^{th}$ signal line group and a $(2N)^{th}$ is located at the edge of the side of the first region 3 close to the display region 2, and the buffer cushion located between the $(2N)^{th}$ signal line group and a $(2N+1)^{th}$ signal line group is located at the edge of the side of the first region 3 close to the second region 4.

Figure 5:
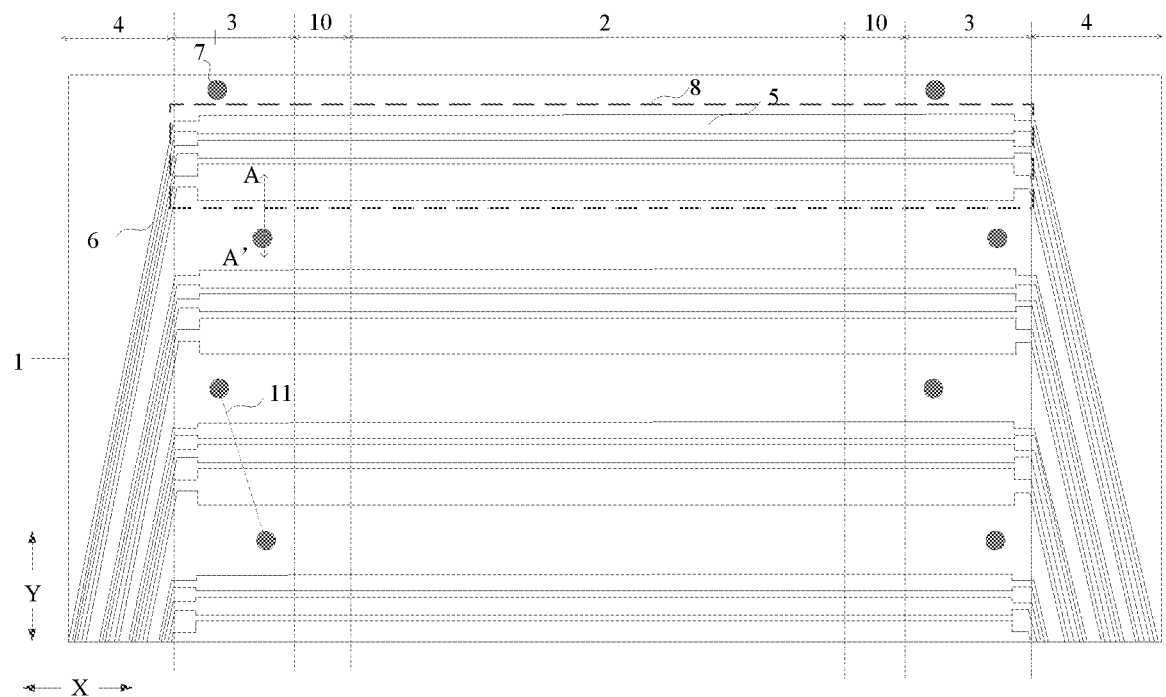
FIG. 5 is a schematic structural diagram of another array substrate provided by an embodiment of the present application.

In some embodiments, as shown in FIG. 5, the flexible base 1 includes two first regions 3, the two first regions 3 are located on two sides of the display region 2 in the first direction X respectively, and distribution rules of the plurality of buffer cushions 7 in the two first regions 3 are the same.

During specific implementation, the distribution rules of the plurality of buffer cushions in the two first regions are the same. For example, as shown in FIG. 5, in one first region 3, the connection line 11 of the buffer cushions 7 located on the two sides of the one same signal line group 8 in the plurality of signal line groups 8 intersects with the first direction and the second direction. Namely, as for each of the first regions 3, the orthographic projections of the buffer cushions 7 on the two sides of the one same signal line group 8 in the plurality of signal line groups 8 in the plane perpendicular to the second direction Y do not overlap with each other. As for each of the first regions 3, the plurality of buffer cushions 7 are distributed alternately on the two sides of the symmetrical axis of the first region 3 parallel to the second direction Y.

In some embodiments, as shown in FIG. 5, distributions of the plurality of buffer cushions 7 in the two first regions 3 are completely consistent.

During specific implementation, as shown in FIG. 5, as for each of the first regions 3, the plurality of buffer cushions 7 are distributed alternately on the two sides of the symmetrical axis of the first region 3 parallel to the second direction Y. Besides, as shown in FIG. 5, as for the buffer cushions 7 in the two different first regions 3 on the same side of one of the signal line groups 8, one of the buffer cushions 7 in one of the first regions 3 is located at the edge of the first region 3 close to the display region 2, and the other of the buffer cushions 7 in the other first region 3 is located at the edge of the first region 3 close to the second region 4.

According to the array substrate provided by the embodiment of the present application, when the two first regions are included in an extending direction of the signal lines, distributions of the plurality of buffer cushions in the two first regions are completely consistent, so that when array substrates are spliced in the first region, the buffer cushions of the different array substrates do not squeeze each other in a splicing region, sliding due to squeezing of the buffer cushions can be avoided, and a yield of the splicing products can be improved.

Figure 6:
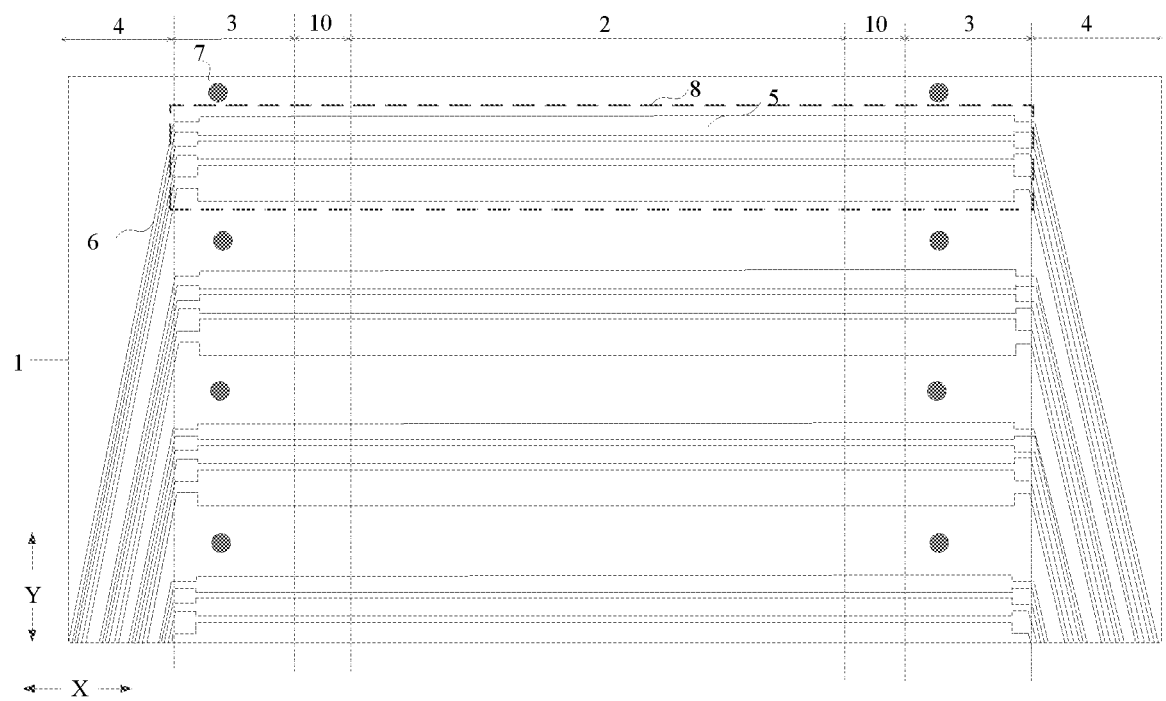
FIG. 6 is a schematic structural diagram of yet another array substrate provided by an embodiment of the present application.

Certainly, in some embodiments, as shown in FIG. 6, when the array substrate includes the two first regions 3 in the extending direction of the signal lines 5, the buffer cushions 7 in each of the first regions 3 may be arranged in sequence along a straight line parallel to the second direction Y. In one of the first regions 3, the buffer cushions 7 are located on the side of the first region 3 close to the display region 2, and the buffer cushions 7 in the other first region 3 are located on one side of the first region 3 facing away from the display region 2, so that the buffer cushions of the different array substrates do not squeeze each other in the splicing process.

Figure 7:
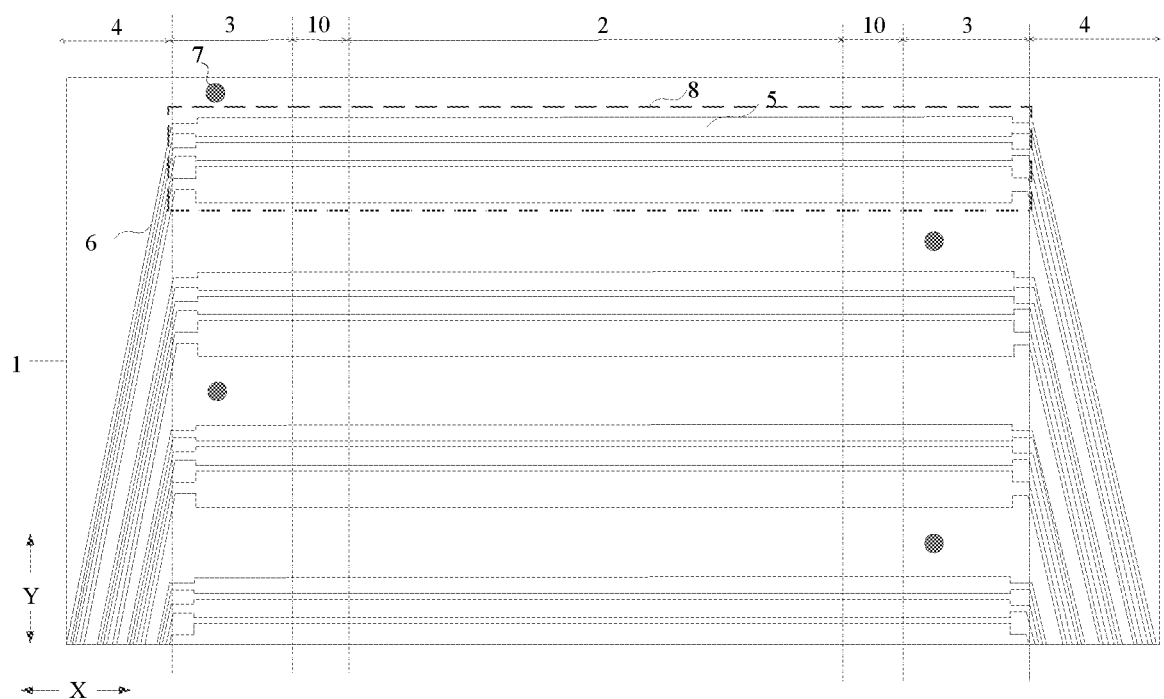
FIG. 7 is a schematic structural diagram of further array substrate provided by an embodiment of the present application.

Alternatively, in some embodiments, also as shown in FIG. 7, the buffer cushions in one of the first regions 3 are located between the $(2N-1)^{th}$ signal line group and the $(2N)^{th}$ signal line group, the buffer cushions in the other first region are located between the $(2N)^{th}$ signal line group and the $(2N+1)^{th}$ signal line group. Thus, the buffer cushions of the different array substrates do not squeeze in the splicing process.

In some embodiments, as shown in FIG. 1, FIG. 5 and FIG. 6, each of the first regions 3 includes the plurality of buffer cushions. Or in some embodiments, each of the first regions 3 includes one buffer cushion 7. During specific implementation, the quantity of the buffer cushions may be set optionally according to a specific width of a first region in the first direction and a size of the buffer cushion.

Figure 8:
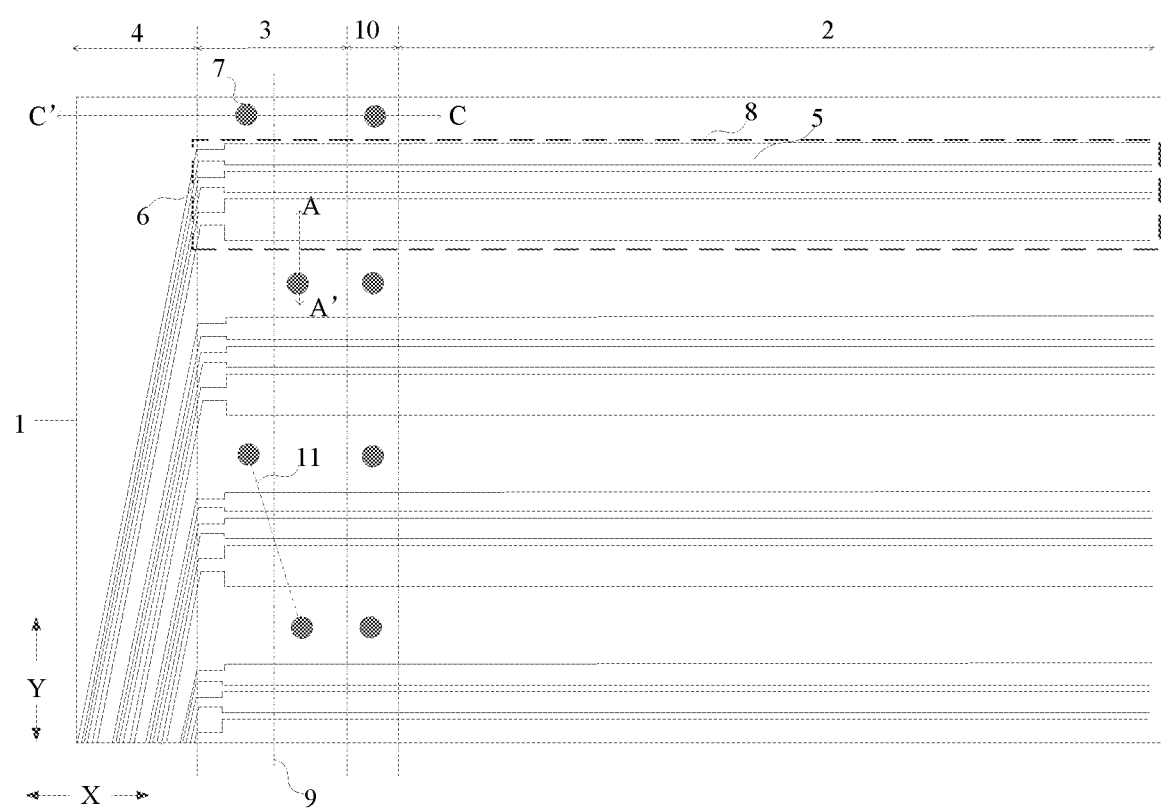
FIG. 8 is a schematic structural diagram of further another array substrate provided by an embodiment of the present application.
Figure 9:
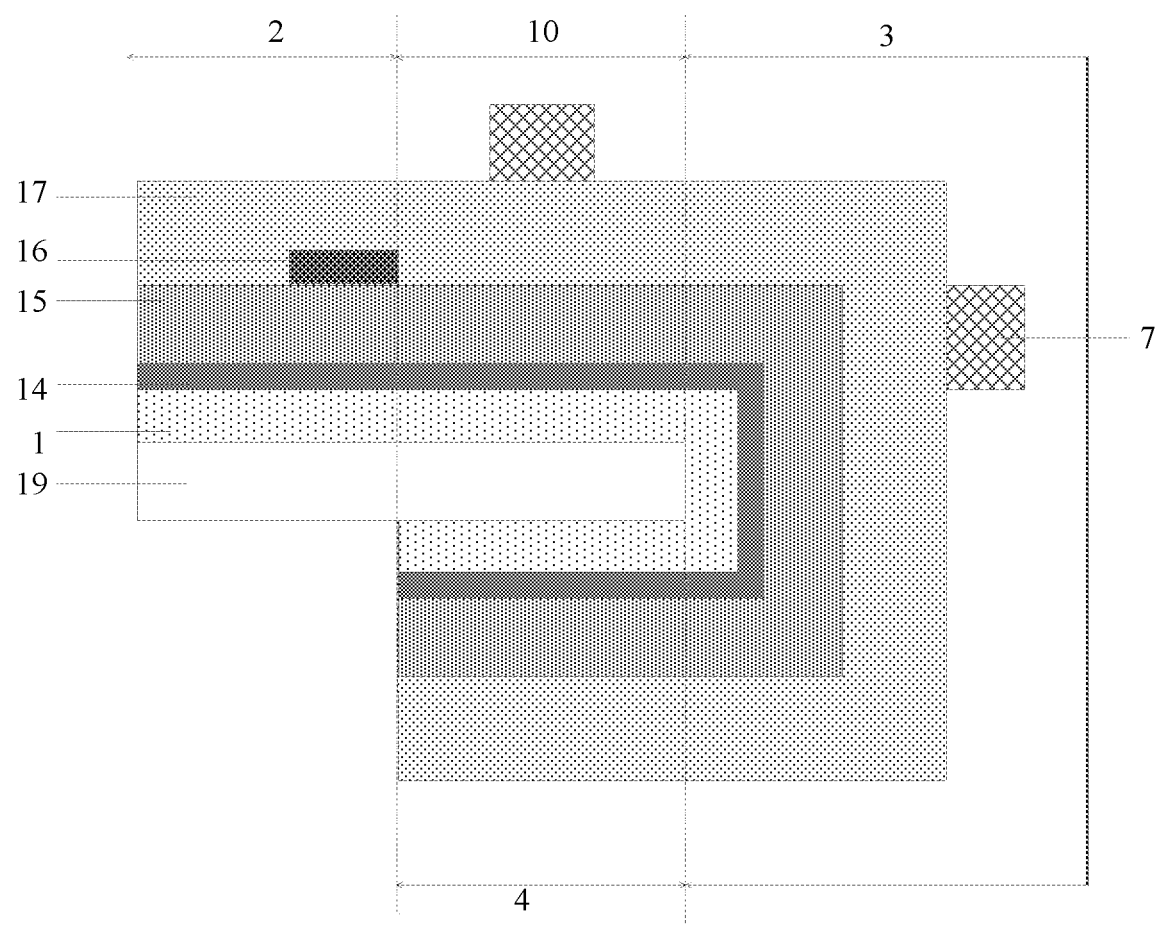
FIG. 9 is a sectional view along CC' in FIG. 8 provided by an embodiment of the present application.

In some embodiments, as shown in FIG. 8 and FIG. 9, the flexible base 1 further includes a third region 10 between the first region 3 and the display region 2.

The third region 10 and the display region 2 are located on the one same plane, and the buffer cushions 7 are further disposed on the third region 10.

It should be noted that FIG. 9 may be, for example, a sectional view along CC' in FIG. 8.

It should be noted that the third region is located between the display region and the first region, and thus the signal lines extend from the display region to the first region via the third region.

It should be noted that when the array substrate is applied to the splicing display product, the third region corresponds to a region nearby a splicing seam. In the splicing technique, the region nearby the splicing seam may protrude, thus the region needs to be pressed so as to make the splicing display product flat, when the third region is pressed, a risk of breaking of the signal lines in the third region is prone to occurring.

According to the array substrate provided by the embodiment of the present application, the buffer cushions are disposed in the third region, though the region nearby the splicing seam needs to be pressed in the splicing technique, only the buffer cushions are pressed because of the buffer cushions, namely, a region with the signal lines is not pressed, and thus the signal lines can be prevented from being pressed and breaking, and the yield of the splicing products can be improved.

During specific implementation, the buffer cushions in the third region may be disposed in a region between the adjacent signal line groups. In the third region 10, the buffer cushions 7 and the signal line groups 8 are distributed alternately. Or in some embodiments, the buffer cushions may be disposed between part of the adjacent signal line groups.

During specific implementation, the buffer cushions in the first region and the buffer cushions in the third region may be formed in the same technical flow, and thicknesses and shapes of the buffer cushions in the first region may be the same as thicknesses and shapes of the buffer cushions in the third region.

In some embodiments, as shown in FIG. 2, FIG. 3, FIG. 4 and FIG. 9, the array substrate specifically includes: a buffer layer 14, located on the flexible base 1; a first metal layer 12, located on the buffer layer 14; a first protection layer 15, located on the first metal layer 12; a second metal layer 13, located on the first protection layer 15 and electrically connected with the first metal layer 12 through a via hole penetrating through a thickness of the first protection layer 15; a passivation layer 16, located on the second metal layer 13; and a second protection layer 17, located on the passivation layer 16, wherein the buffer cushions 7 are located on the second protection layer 17.

It can be understood that the signal lines 5 are composed of the first metal layer 12 and/or the second metal layer 13.

According to the array substrate provided by the embodiment of the present application, the buffer cushions are located on a film layer covering the signal lines, namely, the buffer cushions are disposed in a protruding mode. When at least two array substrates are adjacent to each other to form the splicing display product, though the adjacent array substrates rub or squeeze each other in the first region in the splicing process, as the buffer cushions in the first region are disposed on the second protection layer in a protruding mode, squeezing happens first to the protruding buffer cushions, thus the signal lines on the array substrates can be prevented from physical damage such as breakage caused by abrasion or squeezing, and then a yield of splicing products can be improved.

In some embodiments, as shown in FIG. 4, the first region 3 includes: the flexible base 1, the buffer layer 14, the first protection layer 15, the second metal layer 13, the passivation layer 16, the second protection layer 17 and the buffer cushion. The signal lines 5 are located on the second metal layer 13.

In some embodiments, as shown in FIG. 4, the second region 4 includes: the flexible base 1, the buffer layer 14, the first protection layer 15, the second metal layer 13, the fan-out lines 6 and the second protection layer 17. The fan-out lines 6 is in contact with the second metal layer 13 and is between the second metal layer 13 and the second protection layer 17.

In some embodiments, as shown in FIG. 4, the fan-out lines 6 in the second region 4 may be bonded to a driving chip 20 through a flexible printed circuit (FPC) board 18, so that the driving chip 20 may provide signals for the signal lines 5.

During specific implementation, for example, in a region nearby a boundary between the display region and the third region, the first metal layer is electrically connected with the second metal layer. In addition to the electrically connected portion of the first and second metal layers, the signal lines in the display region beyond only include the first metal layer, and signal lines in the third region, the first region and the second region only include the second metal layer.

Certainly, when the signal lines include two metal layers, which metal layer is specifically included in each region may be set according to actual demands.

In some embodiments, a material of the flexible base includes polyimide (PI).

In some embodiments, a thickness of the flexible base is about in a range from 5.5 micrometers to 6.5 micrometers.

In some embodiments, a material of the buffer layer includes: silicon oxide (SiO) or silicon nitride (SiN).

In some embodiments, a thickness of the buffer layer may be, for example, 0.05 micrometer.

In some embodiments, a material of the first metal layer and the second metal layer may include, for example, copper (Cu).

In some embodiments, a thickness of the first metal layer and the second metal layer may be, for example, 1.8 micrometers.

In some embodiments, a material of the first protection layer and the second protection layer may include, for example, resin. Certainly, other organic materials may be also selected as the material of the first protection layer and the second protection layer.

In some embodiments, a thickness of the first protection layer and a thickness of the second protection layer may be in a range from 2 micrometers to 5 micrometers.

In some embodiments, a material of the passivation layer may include, for example, silicon oxide.

Namely, according to the array substrate provided by the embodiment of the present application, the flexible base, the first protection layer and the second protection layer may be organic film layers, and the buffer layer and the passivation layer may be inorganic film layers.

In some embodiments, as shown in FIG. 2 and FIG. 9, an orthographic projection of the passivation layer 16 on the flexible base 1 does not overlap with the orthographic projections of the buffer cushions 7 on the flexible base 1.

It should be noted that a film layer formed by an inorganic material is prone to cracking in the case of squeezing. According to the array substrate provided by the embodiment of the present application, in the region with the buffer cushions, no passivation layer is disposed under the buffer cushions, thus the situation that the passivation layer cracks due to squeezing of the buffer cushions can be avoided, the situation that cracking of the passivation layer spreads to the region with the signal lines to make the signal lines break is further avoided, and the product yield is further improved.

It should be noted that the orthographic projection of the passivation layer on the flexible base does not overlap with the orthographic projections of the buffer cushions in the flexible base, which means that the orthographic projection of the passivation layer in the region with the buffer cushions on the flexible base does not overlap with the orthographic projections of the buffer cushions on the flexible base. As shown in FIG. 2, an orthographic projection of the portion, in each first region 3, of the passivation layer 16 on the flexible base 1 does not overlap with the orthographic projections of the buffer cushions 7 on the flexible base 1. As shown in FIG. 9, an orthographic projection of a portion, in the third region 10, of the passivation layer 16 on the flexible base 1 does not overlap with the orthographic projections of the buffer cushions 7 on the flexible base 1. An orthographic projection of the passivation layer 16 in the first region 3 on the flexible base 1 does not overlap with the orthographic projections of the buffer cushions 7 on the flexible base 1.

In some embodiments, a material of the buffer cushions includes an elastic material.

According to the array substrate provided by the embodiment of the present application, the material of the buffer cushions includes the elastic material, so that the buffer cushions are damaged, collapse and slide due to squeezing for the buffer cushions can be avoided. When the array substrate is applied to the splicing display product, as the buffer cushions include the elastic material, the buffer cushions are thinner when being squeezed, so that the signal lines can be prevented from being squeezed and breaking, the splicing seam of the splicing display product is reduced, and a display effect of the splicing display product is improved.

During specific implementation, the buffer cushions may select, for example, a material with a high elastic recovery rate. For example, a material with an elastic recovery rate being larger than 90% under the action of 40 meganewton (mN) may be selected.

In some embodiments, the buffer cushions are cylindrical.

According to the array substrate provided by the embodiment of the present application, the buffer cushions are cylindrical, so that the buffer cushions can be further prevented from being squeezed and collapsing.

In some embodiments, the orthographic projections of the buffer cushions on the flexible base are circular, and a radius of the circular is in a range from 25 micrometers to 50 micrometers.

Thus, non-uniform stress caused by too large size of the buffer cushions can be avoided.

In some embodiments, thicknesses of the buffer cushions in a direction perpendicular to the flexible base are smaller than a splicing tolerance. Thus, while squeezing of the region with the signal lines is avoided, the size of the splicing seam is not increased, a smaller size of the splicing seam is guaranteed, and the display effect is guaranteed.

In some embodiments, the splicing tolerance is, for example, 50 micrometers. Namely, the thicknesses of the buffer cushions in the direction perpendicular to the flexible base are smaller than 50 micrometers.

Certainly, it is guaranteed that the buffer cushions are squeezed first when squeezing occurs in the splicing technique, so that the region with the signal lines is not squeezed and does not break. In some embodiments, the thicknesses of the buffer cushions in the direction perpendicular to the flexible base are larger than 25 micrometers.

In some embodiments, a distance between the buffer cushion and one signal line in the plurality of signal lines adjacent to the buffer cushion is larger than 50 micrometers.

According to the array substrate provided by the embodiment of the present application, the distance between the buffer cushion and one signal line adjacent to the buffer cushion is larger than 50 micrometers, so that the situation that the region with the signal lines is squeezed when the buffer cushions are squeezed if the distance between the buffer cushions and the signal line is small can be avoided.

In some embodiments, the array substrate further includes a light-emitting device, the light-emitting device is disposed in the display region, and the display region is located in a plane different from both the planes where the first region and the second region are located.

In some embodiments, the light-emitting device includes a micro-size inorganic light-emitting diode device.

In some embodiments, a micro-size inorganic light-emitting diode may be, for example, a Mini Light Emitting Diode (Mini-LED) or a Micro Light Emitting Diode (Micro-LED).

It needs to be noted that the Mini-LED and the Micro-LED are small in size and high in brightness, thereby massively applied to a display apparatus or its backlight module. For example, a typical size (e.g., a length) of the Micro-LED is smaller than 100 micrometers. A typical size (e.g., a length) of the Mini-LED is 80 micrometers to 350 micrometers.

In some embodiments, a distance between a surface of the buffer cushion facing away from the flexible base and the flexible base is equal to a distance between a surface of the micro-size inorganic light-emitting diode facing away from the flexible base and the flexible base.

In some embodiments, the micro-size inorganic light-emitting diode device is disposed on one side of each of the signal lines facing away from the flexible base. A display panel further includes: a black adhesive layer disposed at least between adjacent micro-size inorganic light-emitting diode devices, and a transparent adhesive layer disposed on one side of the micro-size inorganic light-emitting diode device facing away from the flexible base. The black adhesive layer and the transparent adhesive layer may be disposed only in the display region, so that the black adhesive layer and the transparent adhesive layer are prevented from covering the buffer cushions. During specific implementation, a thickness of the micro-size inorganic light-emitting diode is generally in a range from 70 micrometers to 100 micrometers. In order to protect the micro-size inorganic light-emitting diode and avoid crosstalk between the adjacent micro-size inorganic light-emitting diodes, a total thickness of the black adhesive layer and the transparent adhesive layer usually needs to be larger than 100 micrometers. A thickness of the transparent adhesive layer covering the micro-size inorganic light-emitting diode and the black adhesive layer is usually in a range from 70 micrometers to 80 micrometers.

In some embodiments, as shown in FIG. 3, FIG. 4 and FIG. 9, the array substrate further includes a hard base. The hard base may be, for example, a glass substrate 19. During specific implementation, the flexible base 1 is disposed on the glass substrate 19, namely, the glass substrate 19 is located on one side of the flexible base 1 facing away from the signal lines 5. All film layers of the first region 3 are bent to a side surface of the glass substrate 19. All film layers of the second region 4 are bent to a back surface of the glass substrate 19, and in the second region 4, the second metal layer 13 is bonded to the driving chip 20 through the FPC 18.

In a fabrication technique of the array substrate, the flexible base may be formed on the glass substrate, then the buffer layer, the first metal layer, the first protection layer, the second metal layer, the passivation layer, the second protection layer and the buffer cushions are formed on the flexible base. Then the light-emitting device is bonded, the black adhesive layer and the transparent adhesive layer are disposed on the light-emitting device, a Flexible Printed Circuit (FPC) is bonded, the glass substrate in the first region and the second region is cut out, then the first region is bent. The first region is bent along a side surface of the glass substrate, and thus the second region is disposed on the back surface of the glass substrate.

In some embodiments, the micro-size inorganic light-emitting diode device includes: a red-light micro-size inorganic light-emitting diode device, a blue-light micro-size inorganic light-emitting diode device and a green-light micro-size inorganic light-emitting diode device.

Figure 10:
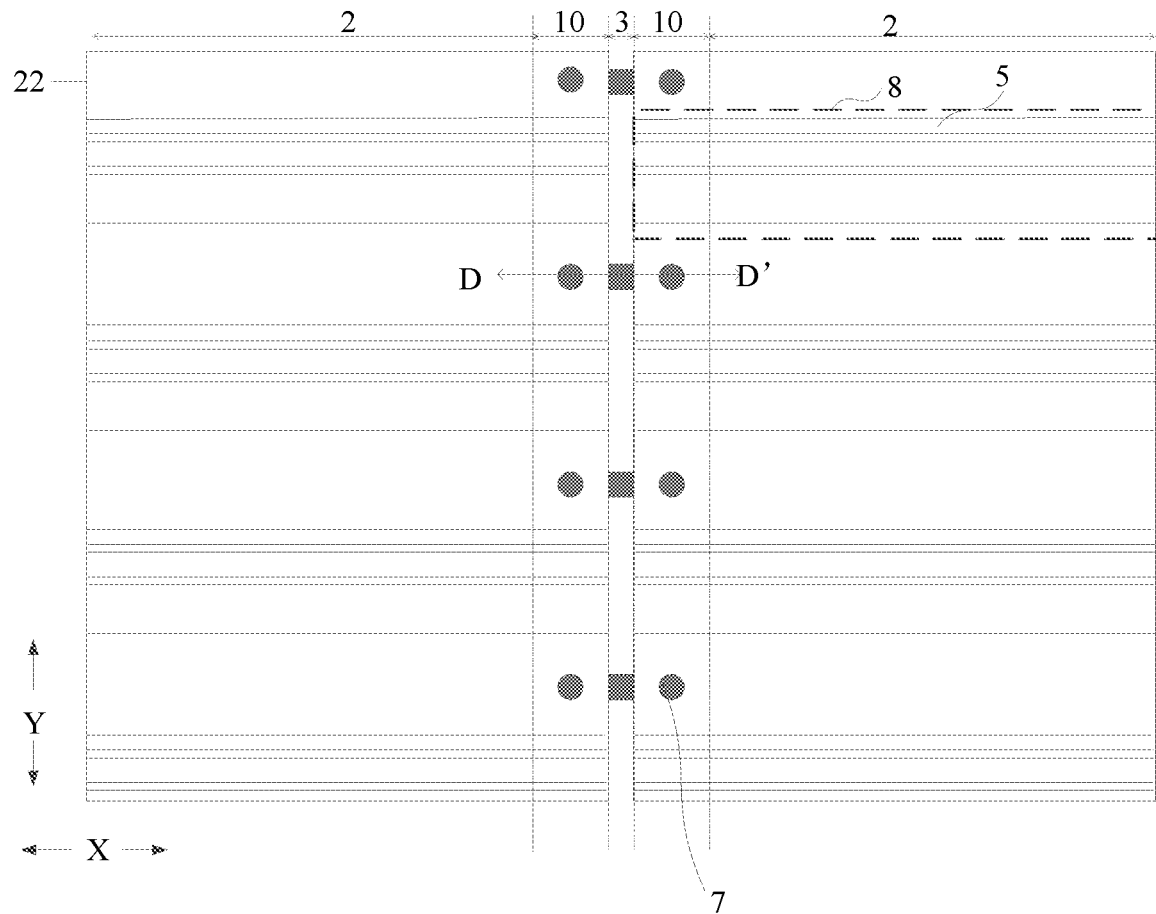
FIG. 10 is a schematic structural diagram of a splicing screen provided by an embodiment of the present application.
Figure 11:
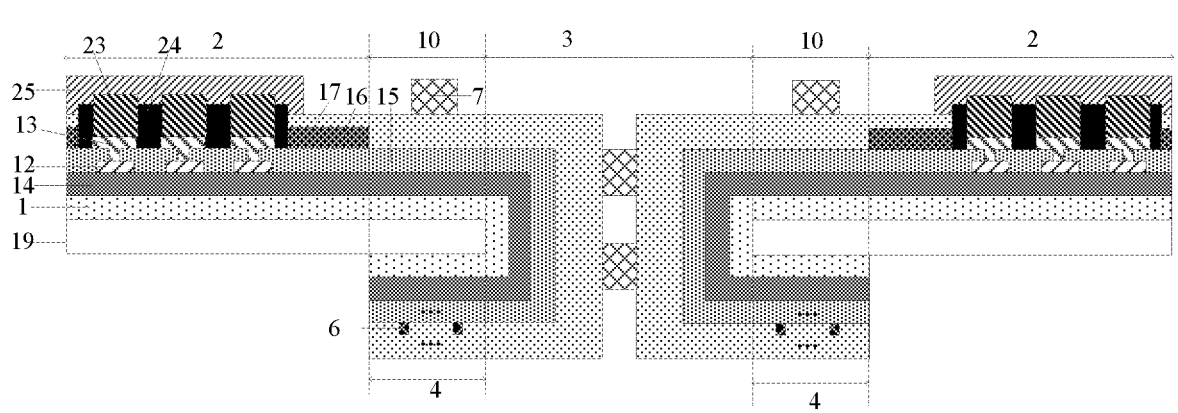
FIG. 11 is a sectional view along DD' in FIG. 10 provided by an embodiment of the present application.

Based on the same inventive concept, an embodiment of the present application further provides a splicing display screen, as shown in FIG. 10 and FIG. 11, including: the plurality of array substrates 22 provided by the embodiment of the present application.

It should be noted that FIG. 10 only shows part of a region of the two array substrates in a splicing display screen. The first regions of the two array substrates in FIG. 10 are adjacent. FIG. 11 may be, for example, a sectional view along DD' in FIG. 10. In FIG. 11, in a display region, the micro-size inorganic light-emitting diode device 23 is electrically connected with the first metal layer 12 through the second metal layer 13. The black adhesive layer 24 fills between adjacent micro-size inorganic light-emitting diode devices 23. The transparent adhesive layer 25 covers the black adhesive layer 24 and the micro-size inorganic light-emitting diode device 23. In FIG. 11, only part of fan-out lines 6 is shown in the second region 4.

During specific implementation, each of the array substrates includes a plurality of pixels. Each of the pixels includes a plurality of sub-pixels. For example, each of the pixels includes three sub-pixels. Each of the sub-pixels may include, for example, a micro-size inorganic light-emitting diode device. In some embodiments, a pixel interval may be in a range from 500 micrometers to 1200 micrometers. In order to guarantee a display effect of a splicing display screen, the pixel intervals of the different array substrates are the same. In some embodiments, an interval between fan-out lines is, for example, 590 micrometers.

During specific implementation, a splicing tolerance between the two spliced array substrates is, for example, 50 micrometers, so that the situation that a too large splicing seam of the splicing display screen affects the display effect can be avoided. Besides, though the splicing tolerance between the two array substrates is small, when rub or squeeze occurs in the first region, the buffer cushions may not squeeze the region with the signal lines because the buffer cushions are disposed in the first region of each of the array substrates, so that the signal lines on the array substrate can be prevented from physical damage such as breaking caused by abrasion and squeezing.

In some embodiments, as shown in FIG. 11, the first regions 3 of the two array substrates 22 are adjacent in the same plane, and the buffer cushions 7 on the different array substrates 22 is not contact with each other.

As shown in FIG. 10 and FIG. 11, in each of the array substrates 22, the first region 3 is bent to the side surface of the glass substrate 19, the first regions 3 of the two array substrates 22 are adjacent, the buffer cushions 7 are disposed on both the third region 10 and the first regions 3, regions with signal line groups 8 of the two array substrates 22 are opposite, the buffer cushions 7 of the different array substrates 22 are staggered, and thus the buffer cushions 7 in the different array substrates 22 do not make contact and are not squeezed with each other. Besides, orthographic projections of the buffer cushions 7 in the different array substrates 22 on a plane where the splicing display screen is located have overlapping regions, so that a splicing seam of the splicing screen is not too large, and a display effect can be improved.

Namely, according to the splicing display screen provided by the embodiment of the present application, when the first regions of the two array substrates are adjacent on the same plane, a region with a signal line group of the first region of one array substrate is opposite to a region with a signal line group of the first region of the other array substrate, in this case, as the buffer cushions are disposed in a region between the adjacent signal line groups, though the adjacent array substrates rub or squeeze in the first regions in a splicing process, the buffer cushions do not squeeze a region with the signal lines, so that the signal lines on the array substrates can be prevented from physical damage such as breaking caused by abrasion or squeezing. Besides, the buffer cushions in the different array substrates do not make contact with each other, namely, buffer cushions of different display panels do not squeeze each other, so that the buffer cushions can be prevented from sliding, and a size of the splicing seam can be reduced.

During specific implementation, the splicing screen further includes a splicing frame. A material of the splicing frame includes aluminum. Specifically, the single array substrate may be installed on the splicing frame, and then the plurality of array substrates may be spliced.

To sum up, according to the array substrate and the splicing screen provided by the embodiments of the present application, the buffer cushions the orthographic projections of which do not overlap with the orthographic projections of the signal lines are disposed in the first regions, when at least two array substrates are adjacent to each other to form the splicing display product, though the adjacent array substrates rub or squeeze each other in the first regions in the splicing process, the signal lines on the array substrates can be prevented from physical damage such as breakage caused by abrasion or squeezing because of the buffer cushions in the first regions, and thus a yield of splicing products can be improved.

It is apparent that those skilled in the art may make various changes and modifications for the present application without departing from the spirit and scope of the present application. In this case, if these changes and modifications of the present application fall in the scope of claims and their equivalents, the present application also intends to include these changes and modifications.

What is claimed is:

1. An array substrate, comprising:
a flexible base, wherein the flexible base comprises a display region, a first region and a second region, the display region and at least one of the first region and the second region are located on different planes, and the first region is between the display region and the second region;
a plurality of signal lines, on the display region and the first region;
a plurality of fan-out lines, on the second region, connected with the plurality of signal lines in a one-to-one correspondence; and
a buffer cushion, on the first region, wherein an orthographic projection of the buffer cushion on the flexible base does not overlap with orthographic projections of the signal lines on the flexible base.

2. The array substrate according to claim 1, wherein the plurality of signal lines are divided into a plurality of signal line groups, each of the plurality of signal line groups comprises at least two adjacent signal lines in the plurality of signal lines; and
a distance between any two adjacent signal lines located in one same signal line group in the plurality of signal line groups is smaller than a distance between any two adjacent signal lines located in different signal line groups in the plurality of signal line groups.

3. The array substrate according to claim 2, wherein the buffer cushion is between the at least two adjacent signal line groups in the plurality of signal line groups.

4. The array substrate according to claim 2, comprising:
a plurality of buffer cushions, wherein the plurality of signal lines extend in a first direction, the plurality of signal line groups are arranged in sequence in a second direction, the first direction and the second direction mutually intersect, the buffer cushions are disposed on two sides of at least one signal line group in the plurality of signal line groups respectively, and a connection line of the buffer cushions located on the two sides of one same signal line group in the plurality of signal line groups intersects with the first direction and the second direction.

5. The array substrate according to claim 4, wherein the flexible base comprises two first regions, wherein the two first regions are located on two sides of the display region in the first direction respectively, and distribution rules of the plurality of buffer cushions in the two first regions are the same.

6. The array substrate according to claim 5, wherein distributions of the plurality of buffer cushions in the two first regions are completely consistent.

7. The array substrate according to claim 1, further comprising:
a light-emitting device on the display region, wherein the display region is located on a plane different from both planes where the first region and the second region are located.

8. The array substrate according to claim 7, wherein the light-emitting device comprises a micro-size inorganic light-emitting diode device.

9. The array substrate according to claim 1, wherein the flexible base further comprises:
a third region, between the display region and the first region; wherein
the third region and the display region are located on a same plane, and the plurality of signal lines and a buffer cushion are further disposed in the third region.

10. The array substrate according to claim 1, wherein components on the flexible base comprise:
a buffer layer, on the flexible base;
a first metal layer, on the buffer layer;
a first protection layer, on the first metal layer;
a second metal layer, on the first protection layer and electrically connected with the first metal layer through a via hole penetrating through a thickness of the first protection layer;
a passivation layer, on the second metal layer; and
a second protection layer, on the passivation layer, wherein the buffer cushion is on the second protection layer.

11. The array substrate according to claim 10, wherein an orthographic projection of the buffer layer and an orthographic projection of the passivation layer on the flexible base do not overlap with the orthographic projection of the buffer cushion on the flexible base.

12. The array substrate according to claim 1, wherein the buffer cushion comprises an elastic material.

13. The array substrate according to claim 1, wherein the buffer cushion is cylindrical.

14. The array substrate according to claim 13, wherein the orthographic projection of the buffer cushion on the flexible base is circular with a radius being in a range from 25 micrometers to 50 micrometers.

15. The array substrate according to claim 1, wherein a thickness of the buffer cushion is in a range from 25 micrometers to 50 micrometers.

16. The array substrate according to claim 1, wherein a distance between the buffer cushion and one signal line of the plurality of signal lines adjacent to the buffer cushion is larger than 50 micrometers.

17. The array substrate according to claim 4, wherein the plurality of buffer cushions are distributed alternately on two sides of a symmetrical axis of the first region parallel to the second direction.

18. The array substrate according to claim 4, wherein the plurality of buffer cushions are arranged in sequence along a straight line parallel to the second direction.

19. A splicing screen, comprising the plurality of array substrates according to claim 1.

20. The splicing screen according to claim 17, wherein in any two adjacent array substrates first regions of which are adjacent, buffer cushions located in the two array substrates is not contact with each other.

* * * * *